(12) United States Patent
Khachatryan

(10) Patent No.: US 9,461,096 B2
(45) Date of Patent: *Oct. 4, 2016

(54) METHOD FOR MANUFACTURING DISPLAY DEVICE

(71) Applicant: Samsung Display Co., Ltd., Yongin (KR)

(72) Inventor: Hayk Khachatryan, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 250 days.

This patent is subject to a terminal disclaimer.

(21) Appl. No.: 14/256,595

(22) Filed: Apr. 18, 2014

(65) Prior Publication Data

US 2015/0044932 A1 Feb. 12, 2015

(30) Foreign Application Priority Data

Aug. 12, 2013 (KR) .................. 10-2013-0095620

(51) Int. Cl.
| | |
|---|---|
| *B29C 65/30* | (2006.01) |
| *B32B 37/06* | (2006.01) |
| *B32B 38/10* | (2006.01) |
| *B32B 43/00* | (2006.01) |
| *H01L 27/32* | (2006.01) |
| *H01L 51/00* | (2006.01) |
| *H01L 51/56* | (2006.01) |

(52) U.S. Cl.
CPC ......... *H01L 27/3244* (2013.01); *H01L 51/003* (2013.01); *H01L 51/56* (2013.01); *H01L 2251/5338* (2013.01)

(58) Field of Classification Search
USPC ............... 156/247, 272.2, 278, 701, 711
See application file for complete search history.

(56) References Cited

U.S. PATENT DOCUMENTS

| | | | |
|---|---|---|---|
| 5,232,860 A | 8/1993 | Kawanishi et al. | |
| 5,258,236 A | 11/1993 | Arjavalingam et al. | |
| 7,029,960 B2 | 4/2006 | Hashimoto et al. | |
| 7,868,094 B2 | 1/2011 | Han et al. | |
| 8,053,331 B2 | 11/2011 | Gadkaree | |
| 9,246,124 B2 * | 1/2016 | Khachatryan | ..... G02F 1/133305 |
| 2011/0061789 A1 | 3/2011 | Matsumoto | |
| 2011/0311789 A1 | 12/2011 | Loy et al. | |

FOREIGN PATENT DOCUMENTS

| | | |
|---|---|---|
| KR | 10-2009-0107451 | 10/2009 |
| KR | 10-1111471 | 2/2012 |
| WO | 00-40648 | 7/2000 |

(Continued)

OTHER PUBLICATIONS

Jesmin Haq et al., "Temporary bond-debond technology for high-performance transistors on flexible substrates," Journal of the Society for Information Display, Nov. 2010, pp. 884-891, vol. 18—Issue 11.

(Continued)

*Primary Examiner* — Sing P Chan
(74) *Attorney, Agent, or Firm* — H.C. Park & Associates, PLC

(57) ABSTRACT

A method for manufacturing a display device includes forming a metal layer on a carrier substrate, laminating a display substrate on the metal layer, supplying a current to the metal layer to heat the metal layer, and separating the display substrate from the metal layer and the carrier substrate.

16 Claims, 8 Drawing Sheets

(56) References Cited

FOREIGN PATENT DOCUMENTS

| WO | 2005-048669 | 5/2005 |
|---|---|---|
| WO | 2005-050754 | 6/2005 |

OTHER PUBLICATIONS

Rebecca J. Jackman et al., "Using Elastomeric Membranes as Dry Resists and for Dry Lift-Off," Langmuir, Mar. 1999, pp. 2973-2984, vol. 15—No. 8, American Chemical Society.

George Wallis and Daniel I. Pomerantz, "Field Assisted Glass-Metal Sealing," Journal of Applied Physics, Sep. 1969, pp. 3946-3949, vol. 40—No. 10.

Hong-Wei Li et al., "Nanocontact Printing: A Route to Sub-50-nm-Scale Chemical and Biological Patterning," Langmuir, Jan. 28, 2003, pp. 1963-1965, vol. 19—No. 6, American Chemical Society.

Gregory P. Crawford, "Flexible Flat Panel Display Technology," Flexible Flat Panel Displays, Jun. 2005, pp. 1-9, John Wiley & Sons, Ltd.

H. Gleskova et al., "a-Si:H TFTs made on polyimide foil by PE-CVD at 150° C.," Proceedings of the Materials Research Society, 1998, pp. 73-78, vol. 508.

F. E. Doany and C. Narayan, "Laser release process to obtain freestanding multilayer metal-polyimide circuits," IBM Journal of Resesarch and Development, Jan./Mar. 1997, pp. 151-157, vol. 41—Issue 1/2.

Rama Puligadda et al., "High-performance temporary adhesives for wafer bonding applications," Materials Research Society Symposium Proceedings, 2007, pp. 239-249, vol. 970.

\* cited by examiner

METHOD FOR MANUFACTURING DISPLAY DEVICE

CROSS-REFERENCE TO RELATED APPLICATION

This application claims priority from and the benefit of Korean Patent Application No. 10-2013-0095620, filed on Aug. 12, 2013, which is hereby incorporated by reference for all purposes as if fully set forth herein.

BACKGROUND

1. Field

Exemplary embodiments of the present invention relate to a method for manufacturing a display device.

2. Discussion of the Background

A recent development in the field of display devices is a flexible display device including a flexible substrate that is lightweight and strong. The display is resistant to impact and is made of a flexible material such as plastics. The flexible display device can be bent or rolled to maximize portability and has many applications in various fields.

The flexible display device includes display elements formed on the flexible substrate. Examples of the display elements that are capable of being used in the flexible display device include an organic light emitting diode display (OLED) element, a liquid crystal display (LCD) element, and an electrophoretic display (EPD) element.

The display elements may each include a thin film transistor (TFT). The flexible substrate, therefore, is subjected to several thin film processes in order to form the flexible display device.

In addition, the flexible substrate subjected to the thin film process is sealed by an encapsulation substrate. The flexible substrate, the thin film transistor formed on the flexible substrate, and the encapsulation substrate constitute a display panel of the flexible display device.

The flexible substrate may be temporarily attached to a carrier substrate while the flexible substrate is subjected to the thin film process.

The above information disclosed in this Background section is only for enhancement of understanding of the background of the invention and therefore it may contain information that does not form the prior art that is already known in this country to a person of ordinary skill in the art.

SUMMARY

Exemplary embodiments of the present invention provide a method for manufacturing a display device in which bubbles between a flexible substrate and a carrier substrate created during a process for manufacturing a flexible display device are effectively removed.

An exemplary embodiment of the present invention provides a method for manufacturing a display device. The method includes forming a metal layer on a carrier substrate, laminating a display substrate on the metal layer, supplying a current to the metal layer to heat the metal layer, and separating the display substrate from the metal layer and the carrier substrate.

Additional features of the invention will be set forth in the description which follows, and in part will be apparent from the description, or may be learned by practice of the invention.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
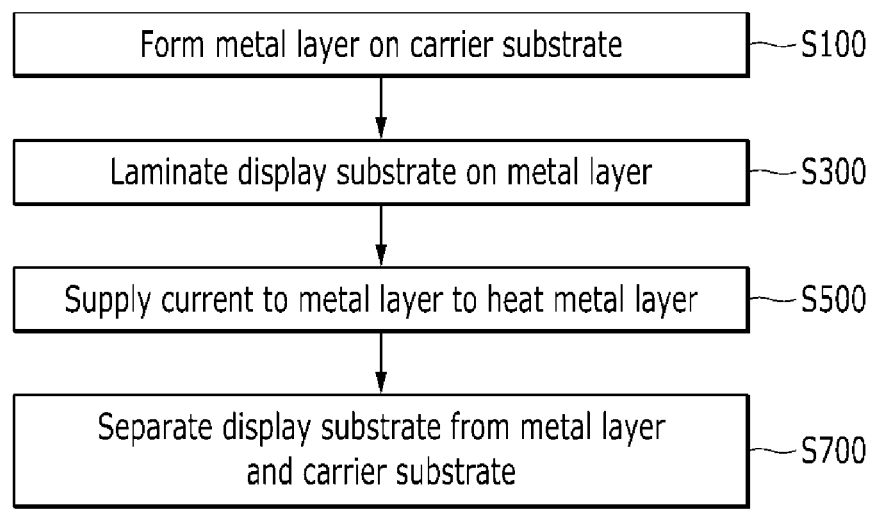
FIG. 1 is a flowchart of a method for manufacturing a display device according to an exemplary embodiment of the present invention.

Hereinafter, exemplary embodiments of the present invention will be described in detail with reference to the accompanying drawings so that those skilled in the art may easily practice the present invention. As those skilled in the art would realize, the described embodiments may be modified in various different ways, all without departing from the spirit or scope of the present invention. The drawings and description are to be regarded as illustrative in nature and not restrictive. Like reference numerals designate like elements throughout the specification.

In addition, the size and thickness of each element shown in the drawings are arbitrarily shown for better understanding and ease of description, but the present invention is not limited thereto.

In the drawings, the thickness of layers, films, panels, regions, etc., are exaggerated for clarity. In the drawings, for better understanding and ease of description, the thicknesses of some layers and areas are exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Further, in the specification, the term "~on" means positioning on or below the object portion, but does not essentially mean positioning on the upper side of the object portion based on a gravity direction. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Referring to FIGS. 1 to 7, in a method for manufacturing a display device according to an exemplary embodiment, a metal layer is formed between a flexible substrate 500 and a carrier substrate 100 in order to remove bubbles formed between the flexible substrate 500 and the carrier substrate 100 (see FIG. 3) during a process for manufacturing the display device.

Figure 3:
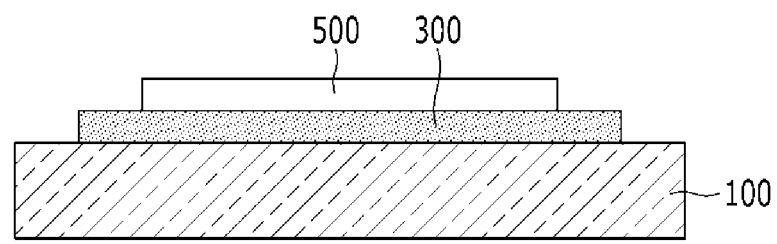
FIGS. 3 to 7 show a process for manufacturing the display device.

Referring to FIGS. 1 and 3, first, a metal layer 300 is formed on the carrier substrate 100 (S100). The carrier substrate 100 is used as a support substrate during the process for manufacturing the flexible display device. The flexible substrate 500 is laminated on the carrier substrate 100 in order to prevent the flexible substrate 500 from bending while various layers are laminated on the flexible substrate 500.

The carrier substrate 100 may be formed of a hard material capable of supporting the flexible substrate 500. For example, the carrier substrate 100 may be a glass substrate or a metal substrate. However, the carrier substrate 100 is not limited thereto, and any carrier substrate capable of supporting the flexible substrate 500 may be used.

The carrier substrate 100 may have an area that is larger than that of the flexible substrate 500 in order to stably support the flexible substrate 500 while the display device is manufactured.

Figure 4:
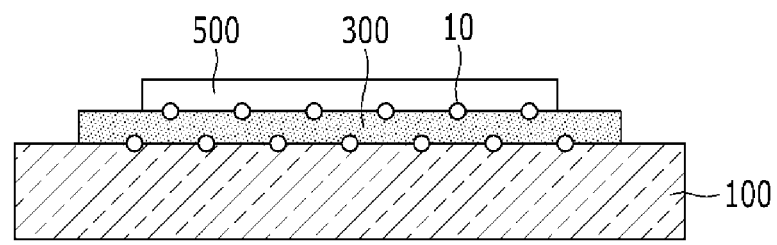

Referring to FIG. 4, the metal layer 300 laminated on the carrier substrate 100 is formed in order to remove bubbles 10 formed between the flexible substrate 500 and the carrier substrate 100. The metal layer 300 may react with the bubbles, that is, air, to remove the bubbles. A detailed description thereof will be given below.

The metal layer 300 may be at least one of titanium, magnesium, zirconium, hafnium, and aluminum. The metal in the metal layer 300 may have heat resistance.

Accordingly, in a step of heating the metal layer 300 (described later), the metal layer 300 may be heated by applying a current to the metal layer 300.

Metal in the metal layer 300 reacts with oxygen or nitrogen in the bubbles which are converted into oxides or nitrides in a solid state. Accordingly, the bubbles in a gaseous state may be converted into matter of a solid state to be removed.

A method for forming the metal layer 300 on the carrier substrate 100 may be performed by laminating a metallic material by a sputtering method or by attaching a metal layer in a film form. In addition, various methods for forming a metal layer on a predetermined substrate may be applied.

A thickness of the metal layer 300 may be 10 to 50 μm. More specifically, the thickness of the metal layer 300 may be 20 to 40 μm. The metal layer 300 may be heated by applying current. Accordingly, heat generated from the metal layer 300 may affect the flexible substrate 500 positioned on the metal layer 300. Accordingly, the metal layer 300 may have a thickness 10 to 50 μm to minimize an effect to the flexible substrate 500 by generated heat.

Next, the substrate 500 is laminated on the metal layer 300 (S300). The substrate 500 may be the flexible substrate. More specifically, a flexible substrate used in the flexible display device may be applied.

Figure 6:
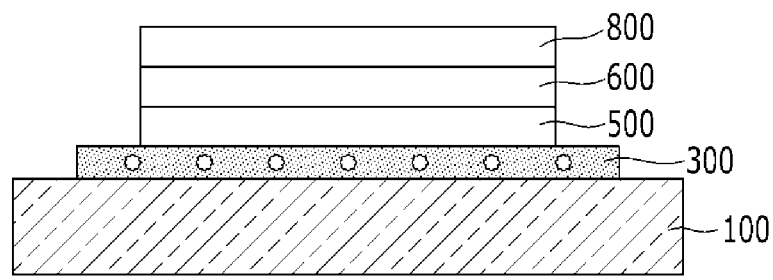

Referring to FIG. 6, a display panel 600 and a sealing substrate 800 may be sequentially laminated on the substrate 500. The display panel 600 is configured to display an image, and may include an organic light emitting layer used in an organic light emitting diode (OLED) display. Detailed descriptions of the display panel 600 and the sealing substrate 800 are described.

Figure 5:
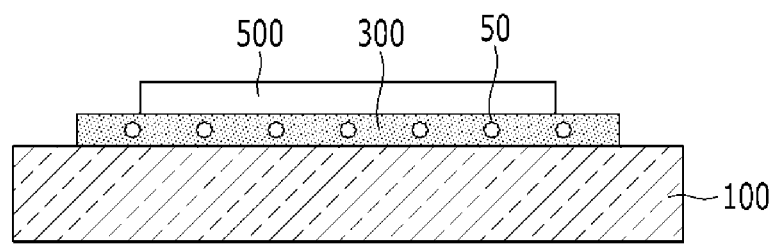

Next, the metal layer 300 is heated (S500). In this case, the current is supplied to the metal layer 300 to heat the metal layer 300. Referring to FIG. 5, when the metal layer 300 is heated, the bubbles react with the metal of the metal layer 300 to be converted into oxides or nitrides 50. Accordingly, the bubbles in the gas state may be solidified to be removed.

In more detail, air is mainly formed of nitrogen ($N_2$) and oxygen ($O_2$). Nitrogen and oxygen that meet the metal layer 300 are converted into nitrides and oxides 50, respectively. Chemical Formula 1 represents conversion of nitrogen and oxygen into nitrides and oxides.

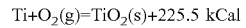

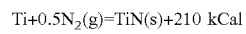  [Chemical Formula 1]

(Herein, g denotes a gas and s denotes a solid)

Below, in an example, titanium (Ti) will be described as metal forming the metal layer 300. However, as described above, the scope of the invention is not limited thereto.

Oxygen ($O_2$) in the gaseous state, which is included in air, reacts with titanium to be converted into titanium dioxide ($TiO_2$) in the solid state.

In addition, nitrogen ($N_2$) reacts with titanium to be converted into titanium nitride (TiN) in the solid state. Heat may be generated from each reaction.

As described above, oxygen ($O_2$) and nitrogen ($N_2$) in the gaseous state are converted into titanium dioxide and titanium nitride 50 in the solid state generated by the reaction with the metal of the metal layer 300. Accordingly, the bubbles formed between the flexible substrate 500 and the carrier substrate 100 may be mostly removed. In other words, due to limitations inherent in the manufacturing process, 100% of the bubbles formed between the flexible substrate 500 and the carrier substrate 100 may not be removed.

In the step of heating the metal layer 300, a heating temperature may be adjusted by adjusting an amount or an application time of the current applied to the metal layer 300. As described above, damage to the flexible substrate 500 due to heat may be prevented by adjusting the amount or the application time of the current to adjust the heating temperature of the metal layer 300.

Figure 7:
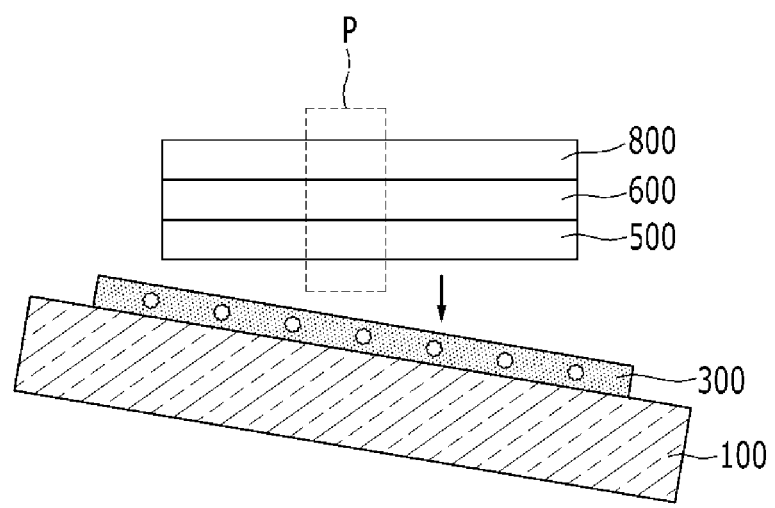

Next, referring to FIG. 7, after the display panel 600 and the sealing substrate 800 are laminated on the flexible substrate 500, the flexible substrate 500 and the metal layer 300 (the carrier substrate 100 is included) are separated from each other (S700). When the carrier substrate 100 is no longer needed after various layers are laminated on the flexible substrate 500 during the process for manufacturing the flexible display device, the carrier substrate 100 may be separated from the flexible substrate 500.

A process for separating the flexible substrate 500 and the carrier substrate 100 is a step that is applied during the process for manufacturing the flexible display device, thus, flexible substrate 500 and carrier substrate 100 may be separated using any suitable process. As a person having skill in the art understands how this may be accomplished, a detailed description thereof will be omitted.

Figure 2:
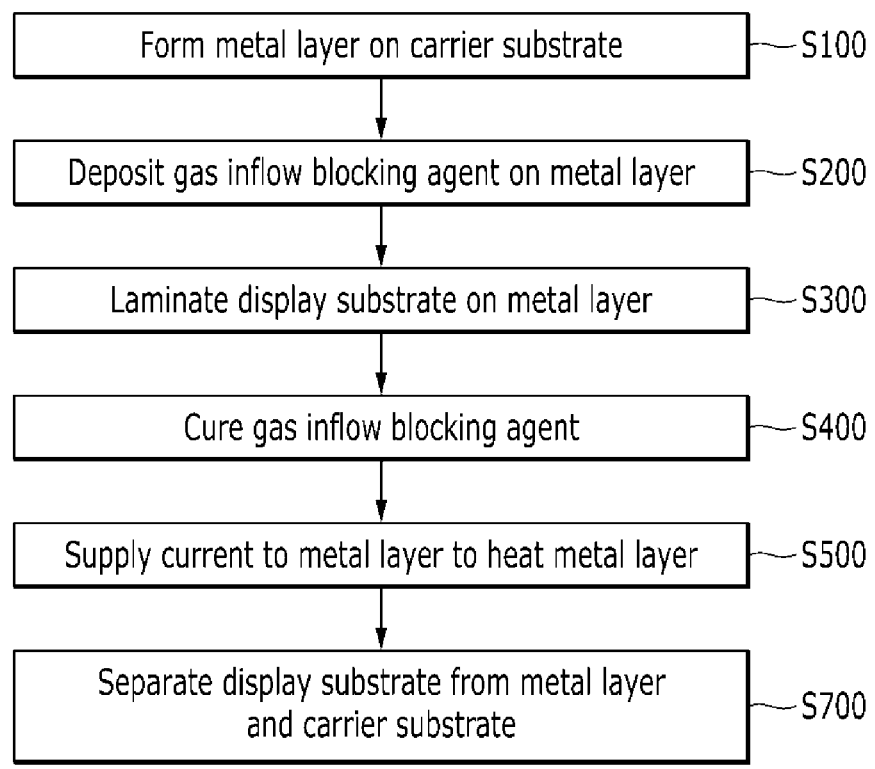
FIG. 2 is a flowchart of a method for manufacturing a display device according to another exemplary embodiment of the present invention.
Figure 8:
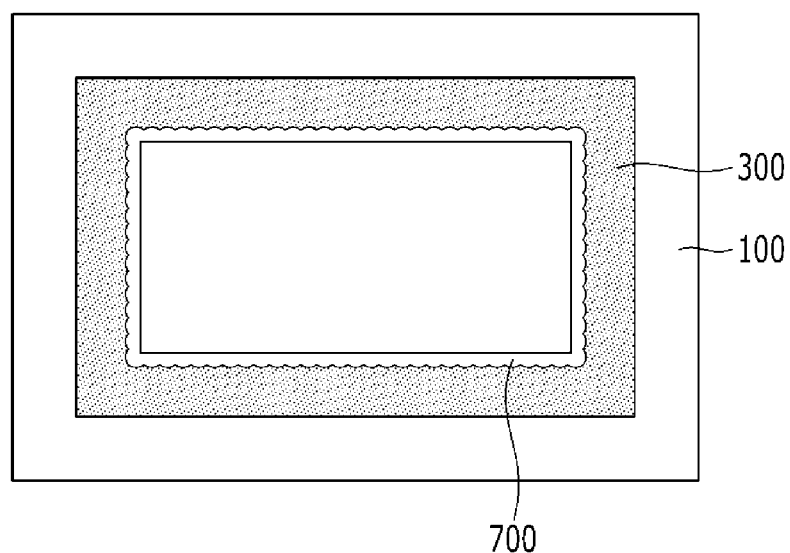
FIGS. 8 and 9 show a process for laminating a gas inflow blocking agent in a process for manufacturing the display device according to another exemplary embodiment of the present invention.
Figure 9:
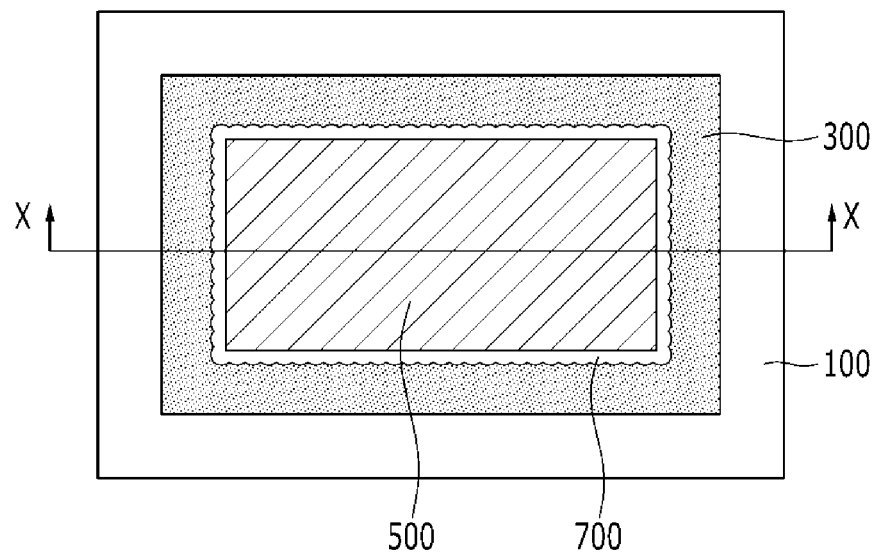

Referring to FIGS. 2, 8, and 9, a method for manufacturing a display device according to another exemplary embodiment may further include depositing a gas inflow blocking agent 700 on the metal layer 300 before the flexible substrate 500 is laminated on the metal layer 300 (S200).

Figure 10:
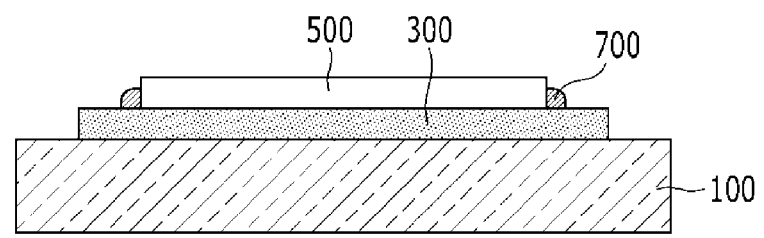
FIG. 10 is a cross-sectional view of the display device of FIG. 9 taken along the line X-X.

Referring to FIGS. 8 and 10, the gas inflow blocking agent 700 is deposited in an edge region of a flexible substrate region, on which the flexible substrate 500 is to be laminated. That is, before the flexible substrate 500 is laminated on the metal layer 300, the gas inflow blocking agent 700 is positioned in an edge of the region on which the flexible substrate 500 is to be laminated.

After the gas inflow blocking agent 700 is laminated on the region, as shown in FIG. 10, the flexible substrate 500 is laminated within the circumference at which the gas inflow blocking agent 700 is positioned.

In this case, while oxygen and nitrogen react with the metal layer 300 to be converted into oxides and nitrides, the gas inflow blocking agent 700 may block inflow of air between the flexible substrate 500 and the carrier substrate 100.

According to another exemplary embodiment, the gas inflow blocking agent 700 may be a heat resistive resin. For example, the gas inflow blocking agent 700 may be a phenyl methyl silicon resin or a polyimide, is not limited thereto.

In addition, the gas inflow blocking agent 700 may be deposited in a thickness of 10 to 40 μm. More specifically, the thickness of the gas inflow blocking agent 700 may be 15 to 25 μm. When the thickness is more than 40 μm, the thickness of the gas inflow blocking agent may be more than the thickness of the flexible substrate 500 to affect other layers laminated on the flexible substrate 500. Further, when the thickness is less than 10 μm, the gas inflow blocking agent 700 cannot effectively block the inflow of air.

Next, before the gas inflow blocking agent 700 is cured, the flexible substrate 500 may be laminated within the circumference at which the gas inflow blocking agent 700 is formed.

Then, the gas inflow blocking agent 700 is cured (S400). That is, the gas inflow blocking agent 700 is positioned at the circumference of the flexible substrate 500 and cured. The gas inflow blocking agent 700 is cured to block the inflow of air between the metal layer 300 and the flexible substrate 500.

According to another exemplary embodiment, the gas inflow blocking agent 700 may be heated to be cured.

The gas inflow blocking agent 700 may be heated to 100 to 300° C. Specifically, the gas inflow blocking agent 700 may be heated to 130 to 250° C. When the temperature is more than 300° C., there is a risk of deformation of the flexible substrate 500, and when heating is performed to a temperature that is less than 100° C., it is difficult to appropriately cure the gas inflow blocking agent 700.

In addition, the gas inflow blocking agent 700 may be heated in the aforementioned temperature range for 5 to 40 minutes. The gas inflow blocking agent 700 may be heated for 10 to 30 minutes. Like the heating temperature, when the heating time deviates from the 5 to 40 minutes, the flexible substrate 500 is deformed or it is difficult to cure the gas inflow blocking agent 700.

The display device manufactured by the method for manufacturing the display device according to the exemplary embodiment is described as an organic light emitting diode display, but it is not limited thereto. The display device may be, for example, a liquid crystal display (LCD), a plasma display panel (PDP), a field emission display (FED), or an electrophoretic display (EPD).

Figure 11:
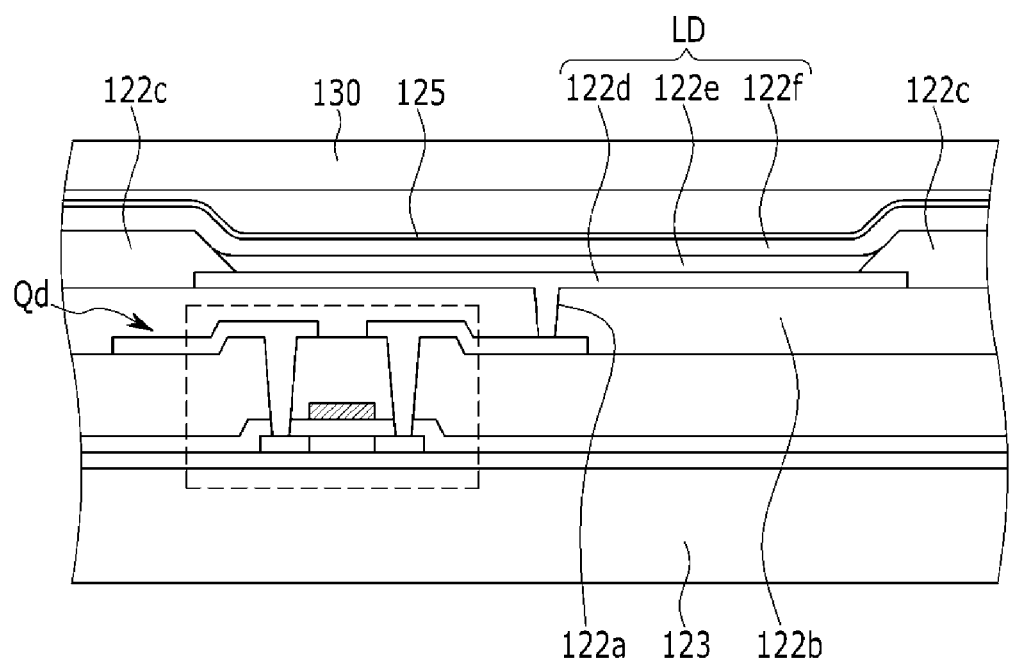
FIG. 11 is an enlarged view of region P of FIG. 7.

Referring to FIGS. 7 and 11, the organic light emitting diode display manufactured by the method for manufacturing the display device according to the exemplary embodiment will be briefly described.

Referring to FIG. 11, a driving transistor Qd is formed on a display substrate 123, which may be made of transparent glass or plastics. The display substrate 123 corresponds to the flexible substrate 500 of FIG. 7.

A protective layer 122b, which may be made of an inorganic or organic material, is formed on the driving transistor Qd. When the protective layer 122b is made of the organic material, a surface thereof may be flat.

A via hole 122a through which a portion of the driving transistor Qd is exposed is formed through the protective layer 122b.

A first electrode 122d is formed on the protective layer 122b. The first electrode 122d may include a reflective electrode and a transparent electrode formed thereon. The reflective electrode may be made of metal having high reflectance, such as silver (Ag) or aluminum (Al), or alloys thereof. The transparent electrode may be made of transparent conductive oxides such as ITO (indium tin oxide) or IZO (indium zinc oxide).

In this case, a pixel definition layer 122c is formed on the protective layer 122b while covering a periphery of an edge of the first electrode 122d.

An organic light emitting layer 122e is formed on the first electrode 122d. A second electrode 122f is formed on the organic light emitting layer 122e and the pixel definition layer 122c.

The organic light emitting layer 122e may further include organic layers (not shown) for effectively transferring carriers of holes or electrons to the light emitting layer in addition to a light emitting layer (not shown) emitting light in practice. The organic layers may be a hole injection layer (HIL) and a hole transport layer (HTL) positioned between the first electrode 122d and the light emitting layer, and an electron injection layer (EIL) and an electron transport layer (ETL) positioned between the second electrode 122f and the light emitting layer.

Further, a capping layer 125 covering the second electrode 122f to protect the second electrode 122f may be formed of an organic layer on the second electrode 122f.

In addition, a sealing substrate 130 may be positioned to be spaced apart from the capping layer 125. In this case, the sealing substrate 130 of FIG. 11 corresponds to a sealing substrate 800 of FIG. 7.

In the method for manufacturing the display device according to the exemplary embodiment, the bubbles generated between the flexible substrate and the carrier substrate may be effectively removed by the metal layer positioned between the flexible substrate and the carrier substrate.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a display device, comprising:
   forming a metal layer on a first substrate;
   disposing a second substrate on the metal layer;
   supplying a current to the metal layer to heat the metal layer; and
   separating the second substrate from the metal layer and the first substrate.

2. The method of claim 1, wherein the metal layer comprises at least one of titanium, magnesium, zirconium, hafnium, and aluminum.

3. The method of claim 1, wherein a thickness of the metal layer is in a range of 10 μm to 50 μm.

4. The method of claim 3, wherein the thickness of the metal layer is in a range of 20 μm to 40 μm.

5. The method of claim 1, further comprising,
before the second substrate is disposed on the metal layer, depositing a gas inflow blocking agent on the metal layer in a region where a circumference of the second substrate is to be disposed.

6. The method of claim 5, wherein the gas inflow blocking agent comprises a heat resistive resin.

7. The method of claim 6, wherein the heat resistive resin comprises at least one of a phenyl methyl silicon resin and a polyimide.

8. The method of claim 6, further comprising, after the second substrate is disposed on the metal layer, curing the gas inflow blocking agent.

9. The method of claim 8, wherein curing the gas inflow blocking agent comprises heating.

10. The method of claim 9, wherein the gas inflow blocking agent is heated in a range of 100° C. to 300° C.

11. The method of claim 10, wherein the gas inflow blocking agent is heated in a range of 130° C. to 250° C.

12. The method of claim 11, wherein the gas inflow blocking agent is heated in a range of 5 to 40 minutes.

13. The method of claim 12, wherein the gas inflow blocking agent is heated in a range of 10 to 30 minutes.

14. The method of claim 5, wherein a deposition thickness of the gas inflow blocking agent is in a range of 10 μm to 40 μm.

15. The method of claim 14, wherein the deposition thickness of the gas inflow blocking agent is in a range of 15 μm to 25 μm.

16. The method of claim 5, wherein the second substrate is disposed on the metal layer within a circumference of the deposited gas inflow blocking agent.

* * * * *